United States Patent [19]

Tocci

[11] Patent Number: 4,523,300
[45] Date of Patent: Jun. 11, 1985

[54] CHEVRON DETECTOR EXPANDER FOR MAGNETIC BUBBLE DOMAIN SYSTEM

[75] Inventor: Leonard R. Tocci, Mission Viejo, Calif.

[73] Assignee: Rockwell International Corporation, El Segundo, Calif.

[21] Appl. No.: 546,068

[22] Filed: Apr. 28, 1980

Related U.S. Application Data

[63] Continuation of Ser. No. 278,501, filed as PCT US 80/00489, Apr. 28, 1980, published as WO 81/03237, Nov. 12, 1981, § 102(e) date Apr. 28, 1980, abandoned.

[51] Int. Cl.³ ............................................. G11C 19/08
[52] U.S. Cl. ...................................................... 365/43
[58] Field of Search ..................................... 365/8, 43

[56] References Cited

U.S. PATENT DOCUMENTS

| | | | |
|---|---|---|---|
| 3,702,995 | 11/1972 | Bobeck et al. | 340/174 EB |
| 3,810,132 | 5/1974 | Bobeck | 340/174 EB |
| 3,979,738 | 9/1976 | Feuersanger et al. | 365/8 |
| 3,988,723 | 10/1976 | Kochel et al. | 340/174 TF |
| 4,020,476 | 4/1977 | Bonyhard | 365/43 |
| 4,157,591 | 6/1979 | Dekker et al. | 365/43 |
| 4,271,485 | 6/1981 | Almasi et al. | 365/8 |
| 4,404,652 | 9/1983 | Holmes | 365/43 |

OTHER PUBLICATIONS

Electronics, May 10, 1979—pp. 117-122—"Bubble Memories Demand Unique Test Methods", by Steve Bisset.

Primary Examiner—James W. Moffitt
Attorney, Agent, or Firm—H. Fredrick Hamann; Wilfred G. Caldwell

[57] ABSTRACT

A magnetic bubble domain system including a layer of magnetic material in which magnetic bubble domains can be propagated and a bubble domain guide structure coupled to the layer for defining first and second channels for the movement of domains. The bubble domain is injected from the first channel into the second channel at a point where the end of the domain does not experience the isolated end of an element of the guide structure. One implementation of this structure is an arrangement of guide structures so that the direction of propagation in the first channel is substantially perpendicular to the direction of propagation in the second channel.

The second channel is formed by a pattern of magnetically operative discrete elements, typically including a plurality of groups of closely spaced chevron elements, each chevron element having a first end portion, a center portion, and a second end portion, the respective center portions of the chevron elements in one column being disposed on an axis, the axes of each of the groups being disposed parallel to one another. The second channel operates as a bubble expander structure for bubble detection.

24 Claims, 5 Drawing Figures

CHEVRON DETECTOR EXPANDER FOR MAGNETIC BUBBLE DOMAIN SYSTEM

The invention herein described was made in the course of or under a contract or subcontract thereunder, with the U.S. Air Force.

This application is a continuation of application Ser. No. 278,501, filed as PCT U.S. 80/00489, Apr. 28, 1980, published as WO 81/03237, Nov. 12, 1981, § 102(e) date Apr. 28, 1980, now abandoned.

TECHNICAL FIELD OF THE INVENTION

The invention is concerned with device architecture for magnetic bubble domain systems, and in particular with the configuration of magnetic elements used to form a guide structure for the propagation and specifically, stretching and detection of bubble domains.

BACKGROUND ART

Magnetic bubble domain devices are well known in the art. The most familiar mode of operating a magnetic bubble device is termed the "field-access" mode. In this mode, a pattern of magnetically soft elements (such as Permalloy) is formed in a plane adjacent a layer of material in which the bubbles are moved. A magnetic field is generated in the plane of the layer and the field caused to reorient to incrementally-offset radial positions cyclically in the plane. Each element is so shaped that various portions thereof respond to the in-plane field to generate pole-patterns which change as the field precesses. The configuration of adjacent elements sets up a sequence of travelling potential wells in the layer which causes bubble movement.

Since data is represented by such a small entity—the magnetic bubble—in a device of this type, the bubble must be expanded laterally with respect to the axis of movement of bubbles in its propagation path. An elongated bubble is necessary in order for the bubble to make a sufficient change in a magneto-resistive detector incorporated in the propagation path to achieve an adequate output signal level from the detector. The preferred technique used to increase the bubble size as the bubble is propagated involves the use of increasing numbers of Permalloy elements in a progression of stages corresponding to the bubble propagation path which leads up to the magneto-resistive detector. Such an arrangement is commonly referred to as an "expander detector". Various types of chevron stretcher detectors used in magnetic bubble domain systems are known. Although these chevron stretcher detectors are satisfactory for most commercial applications, the failure of bubble propagation has been observed on a bubble propagation path at the rapid expander transition at the point where an asymmetrical chevron meets the chevron expander. The same failure mode has also been observed on the gradual transition expander design occurring typically at the points where the strip expands to the next chevron stack. In such a case the failure is more severe when the stretch differential between the chevron stacks is increased. The failure is also more severe as the frequency is increased. It has been suggested that such failure is associated with the redeposition that can result from the ion milling of the Permalloy propagation pattern. Redeposition forms very thin walls of permalloy possible mixed with oxide on the periphery of the propagation elements. These walls are apparently magnetic and can reduce the effective magnetic pole strength and the drive on the bubble. In the case of the expander this reduced drive is more apparent in the regions of the expander where chevrons are not located next to other chevrons. Although removal or elimination of the redeposition essentially eliminates the failure over nominal operating conditions (0° C. to 100° C. at 150 kHz), it is possible that propagation reliability in the stretcher may still be a problem at higher frequencies or at lower temperatures, since free ended chevrons pose a different environment to the stretching bubble and possibly a lower drive.

SUMMARY OF THE INVENTION

Briefly, and in general terms, the invention provides a novel orthogonal transition design for use with a chevron stretcher detector. Such design permits bubble propagation to take place more reliably and with less probability of failure than with previously known designs. The present invention provides a magnetic bubble domain system comprising a layer of magnetic material in which magnetic bubble domains can be propagated; a bubble domain guide structure coupled to the layer for defining first and second channels for the movement of domains, the direction of movement of bubble domains in the direction of propagation of one channel with respect to the other "being substantially perpendicular" is a result of the patterns used to implement the concept. The concept itself is to inject the bubble into the stretcher or expander region of a bubble detector at a point where the bubble or stripe end (as it expands) experiences no isolated chevron arm as it does in previously known expanders. It essentially doesn't matter at which point the second channel becomes a bubble expander guide structure.

The novel features which are considered as characteristic for the invention are set forth in particular in the appended claims. The invention itself, however, both as to its construction and its method of operations, together with additional objects and advantages thereof will be best understood from the following description of specific embodiments when read in connection with the accompanying drawings.

BEST MODE FOR CARRYING OUT THE INVENTION

Figure 1A:
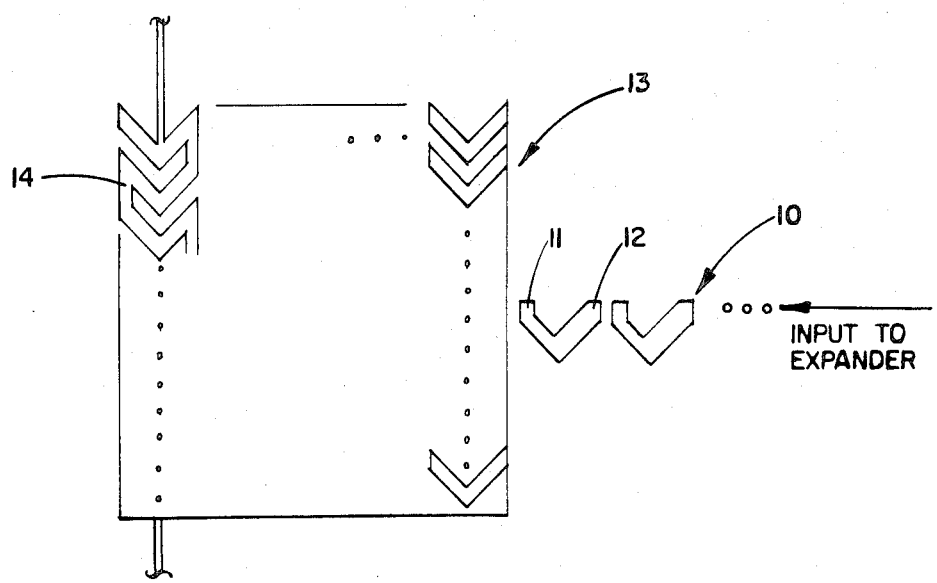
FIG. 1(a) is a first example of a chevron stretcher detector as used in bubble devices as known in the prior art.
Figure 1B:
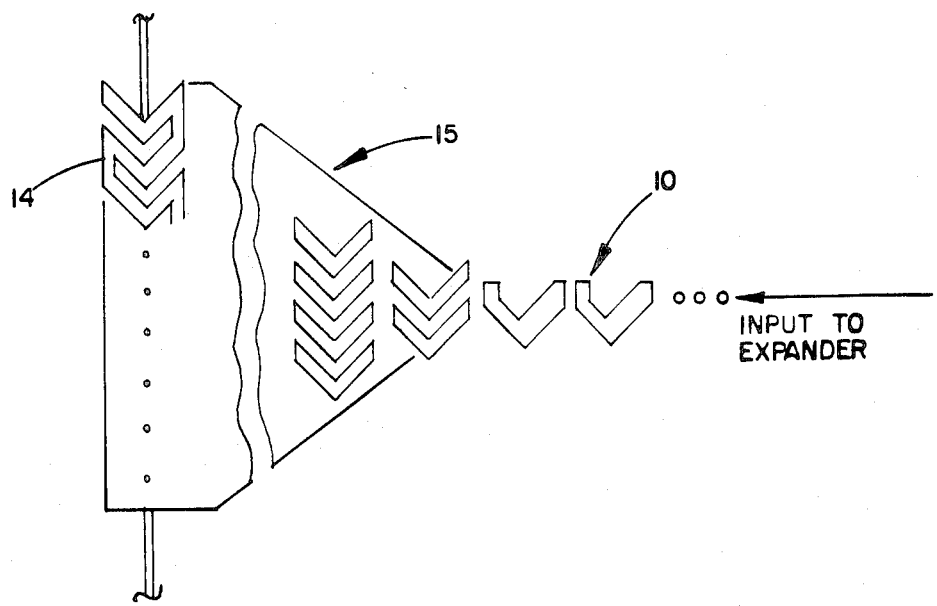
FIG. 1(b) is a second example of a chevron stretcher detector having a gradual expander with an in-line transition to the expander as known in the prior art.

Turning now to FIG. 1(a) there is shown a top plan view of the Permalloy layout of a chevron stretcher detector as used in magnetic bubble domain devices according to the prior art. The input to the expander, shown on the right hand portion of the FIG. 1(a) preferably consists of a single row 10 of asymmetrical chevrons. Although asymmetrical chevrons are used here as an example, it must be realized that other periodic patterns of elements could be used as well. The chevrons shown here are asymmetrical in the sense that the left end portion 11 of each chevron has two right angles, while the right end portion 12 only has a single right angle. The bubbles travel from the right toward the left along the row of chevrons. Once a bubble jumps from the row of single chevrons to the block of chevrons 13, the bubble expands in a vertical direction, and continues its motion towards the left with the rotation of the in-plane field. At the far left hand portion of FIG. 1(a) is shown the typical sensor configuration 14 consisting of interconnected chevrons. FIG. 1(b) is a second example of a Permalloy layout of chevron stretcher detector for magnetic bubble domain devices with an inline transition to the expander also as known in the prior art. In this configuration the block 13 of FIG. 1(a) has been replaced by a wedge 15 which expands in thickness from the single row 10 of chevrons to the length of the detection 14. As in FIG. 1(a), the bubble moves from the right to the left with the rotation of the field.

Figure 2:
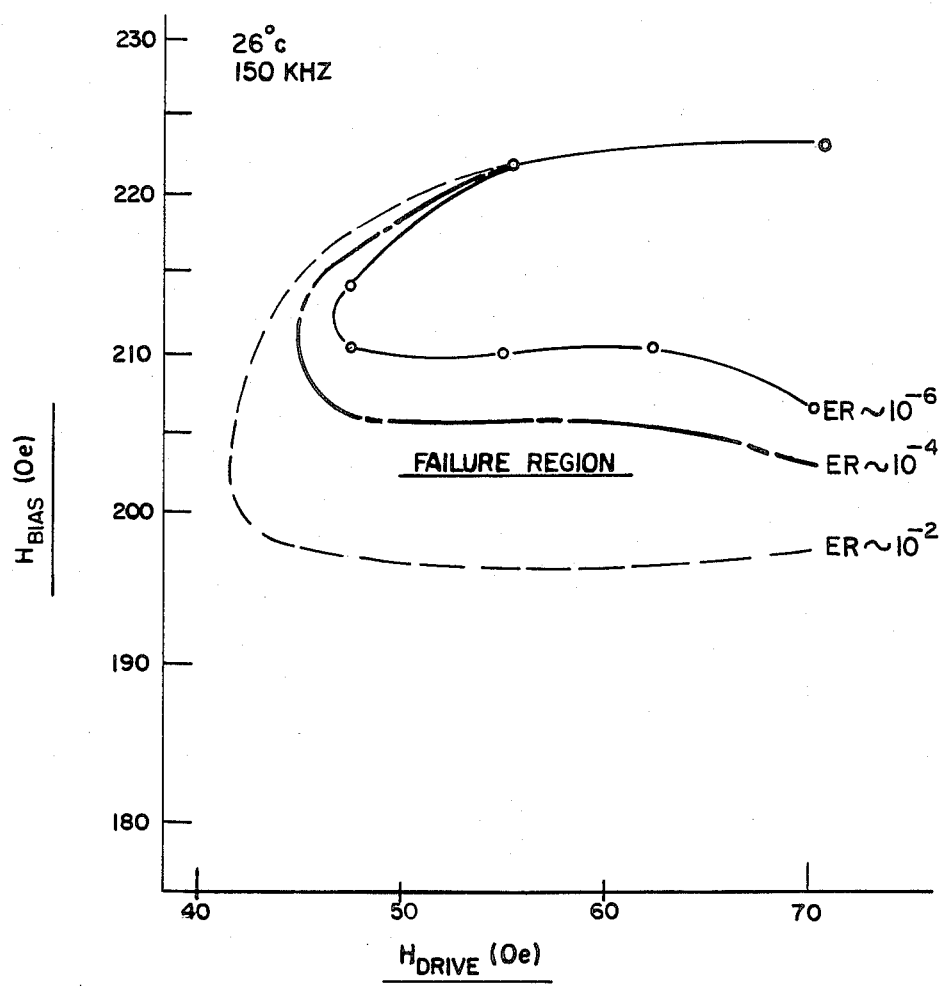
FIG. 2 is a plot of the drive field versus the bias field which permits bubble propagation. Shown are three curves representing measurements at three error rates. The bottom margin edge has a very severe margin degradation (−4.5 to −1.5 Oe /decade) as a result of a failure in the expander.

FIG. 2 shows the bias margin as a function of the rotating magnetic field strength that might be expected according to the configuration shown in FIGS. (1a) and 1(b) of the prior art with redeposition walls. It is noted that from various considerations the operational bias margin expected for a $10^{-6}$ error rate is shown by the dashed line; however, in the actual measurement this margin has a considerably lower error rate ($\sim 10^{-2}$). For a $10^{-6}$ error rate, the actual margin is shown by the solid line and is indicative of the disadvantage of the prior art configurations shown in FIGS. 1(a) and 1(b). The curve shown by the dashed-dotted line represents an error rate of $10^{-4}$.

Figure 3:
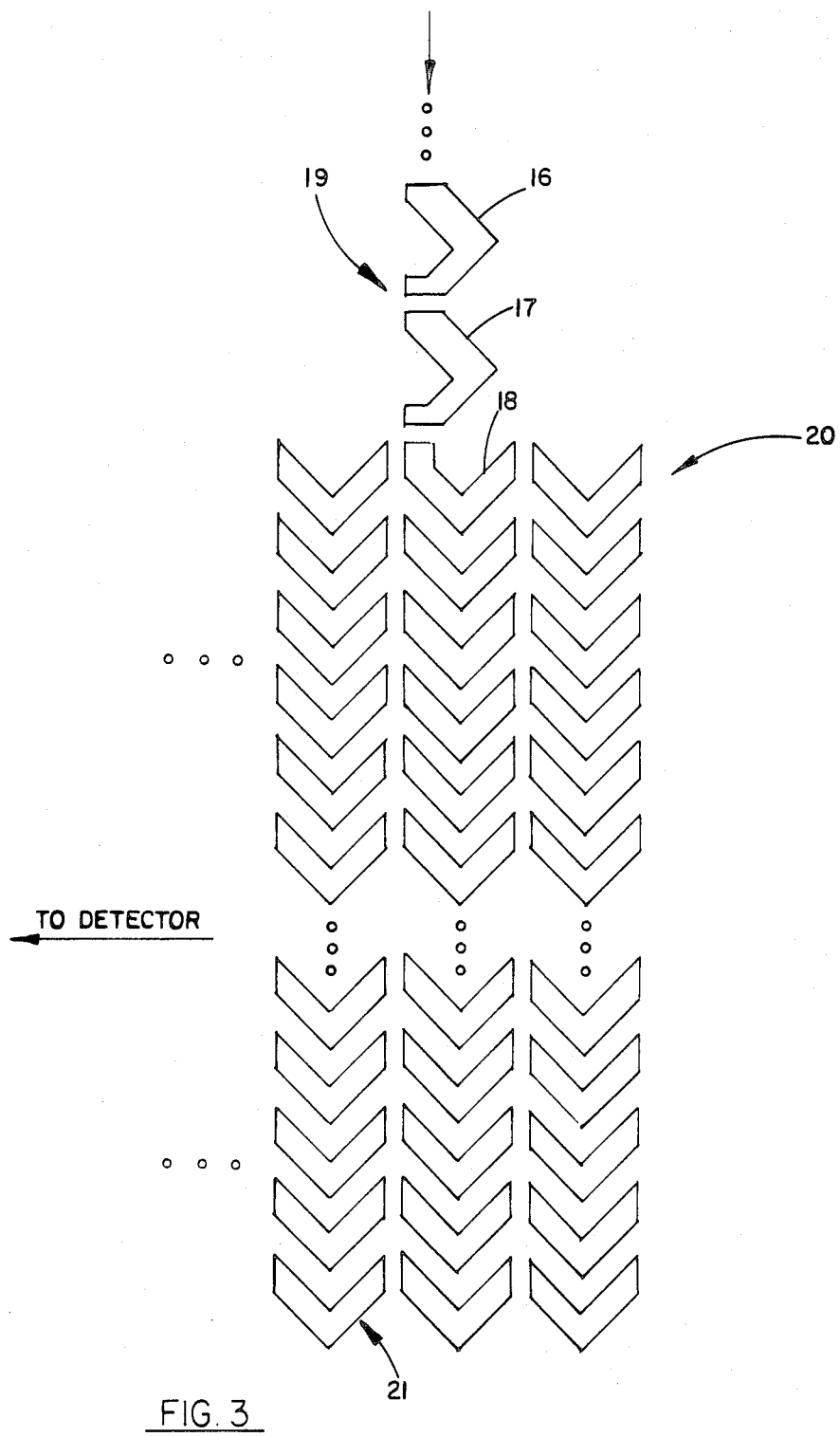
FIG. 3 is a first embodiment of the present invention which provides an orthogonal transition to the expander.

FIG. 3 is the top plan view of the Permalloy layout of a chevron stretcher detector according to the present invention. Although the bubble domain guide structure is shown here as a column of asymmetrical chevrons 19, it must be realized that other periodic patterns of elements could be used as well. In this figure the bubble move along a single column of asymmetrical chevrons, e.g. chevron elements 16 and 17. After a bubble passes element 17 it encounters the block 20, and more particularly the chevron element 18, where the bubble expands in the vertical direction. As the in-plane field rotates, the expanded bubble then shifts over to the chevron column 21 and so proceeds towards the detector. Such a configuration provides an orthogonal transition from a single line of chevrons 19 to the expander and detector, and provides an environment in which the stripe domain does not experience any expander chevrons that are not adjacent to another chevron. In the preferred embodiment defined in FIG. 3, the single column 19 can be said to define a first channel for bubble movement, while the block 20 defines a second channel, the direction of movement in the second channel being substantially perpendicular to that in the first channel.

The first channel 19 is composed of substantially identical asymmetrical chevrons 16, 17. Such chevrons include a right angled corner portion in both of the end portions of the chevron. More particularly, the left end portion (the direction being defined with the convex point of the chevron pointing down) of the asymmetric chevron includes two right angles, while the right end portion has one.

The chevrons in the block 20 are shown as substantially identical symmetrical chevrons, with the exception of the one chevron 18 which is disposed adjacent to the asymmetrical chevron 17 in the first channel. Block 20 may be composed of elements of other patterns, including asymmetrical patterns. The left end portion of the asymmetrical portion 18 includes two right angles and is disposed essentially adjacent to the left end portion of the asymmetric chevron 17.

Figure 4:
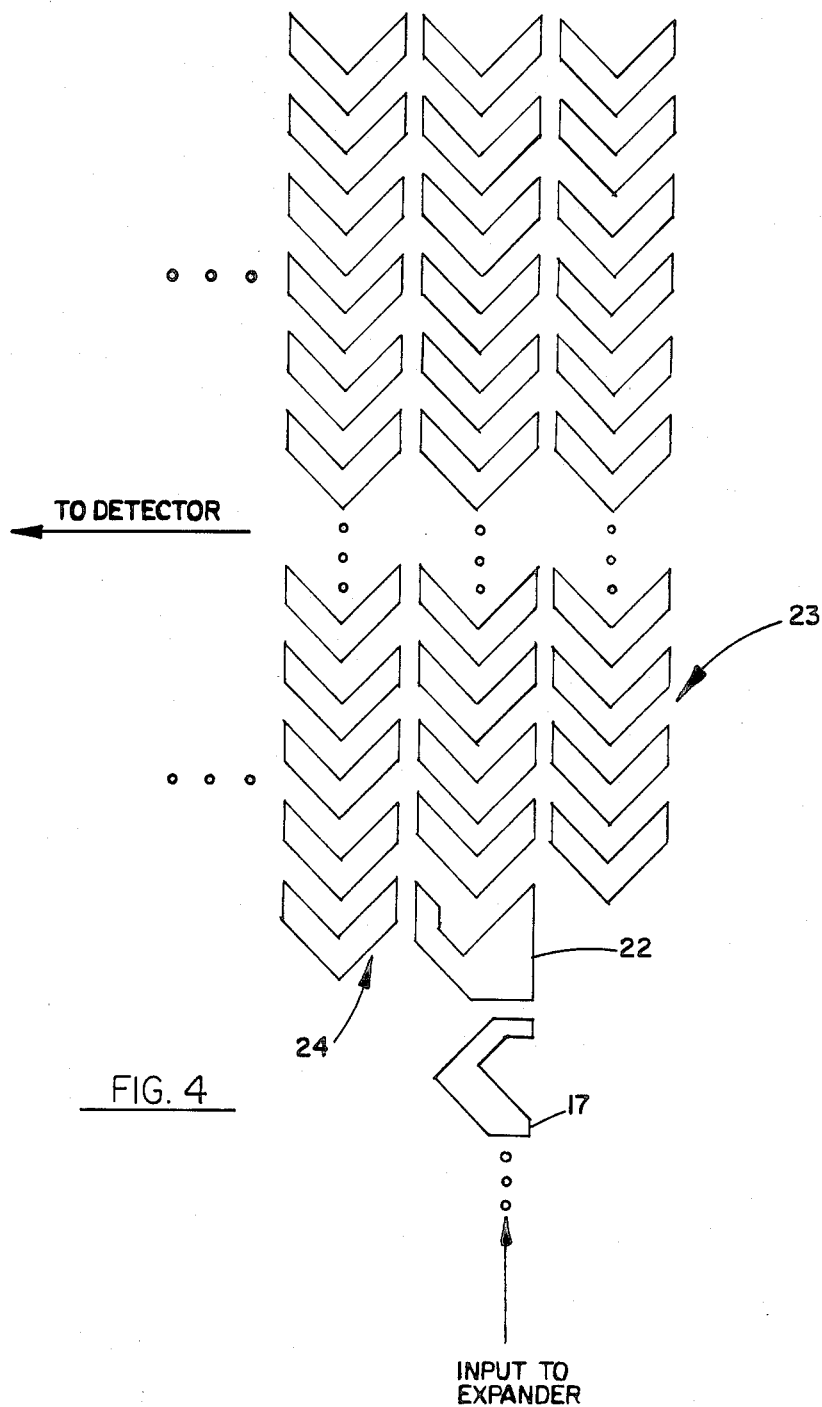
FIG. 4 is a second embodiment of the present invention which also provides an orthogonal transition to the expander.

Turning now to FIG. 4, there is shown another top plan view of a Permalloy layout of a chevron stretch detector according to the present invention. In this figure the bubbles move along a single column of asymmetrical chevrons, e.g. chevron element 17. After a bubble passes element 17 it encounters the block 23, and more particularly the chevron element 22 where the bubble expands in the vertical direction. As the in-plane field rotates, the expanded bubble then shifts over to the chevron column 24 and so proceeds towards the detector.

Like in FIG. 3, the single column can be said to define a first channel for bubble movement, while the block 23 defines a second channel, the direction of movement in the second channel being sustantially perpendicular to that in the first channel in the present embodiment. Like in FIG. 3, this layout provides an environment in which the stripe domain does not experience any expander chevrons that are not adjacent to another chevron.

Now the first channel in FIG. 4 is substantially identical to that in FIG. 3 and therefore need not be described in detail. The chevrons in the block 23 are shown as substantially identical symmetrical chevrons except for the chevron 22 adjacent to the chevron 17 in the first channel. The block 23, like the block 20, may be composed of elements of other patterns, including asymmetrical patterns. The chevron 22 is an asymmetrical chevron which includes one right angle in the right hand end portion which is disposed adjacent to the left hand end portion of the chevron 17. The left hand end portion of the chevron 22 does not contain any right angle.

While the invention has been illustrated and described as embodied in a chevron detector expander for magnetic bubble domain system and method of fabrication, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The configuration and distance between the guide elements, as well as their distance to the magnetic bubble laryer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example, hexagonal ferrites or various crystalline compounds may be used. Moreover, the source, orientation, and frequency of the magnetic field, and the static or dynamic nature of the signals applied to the device may be suitably selected as desired for a particular application.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

I claim:

1. A magnetic bubble domain system comprising:
a layer of magnetic material in which magnetic bubble domains can be propagated; and
a bubble domain guide structure coupled to said layer for defining first and second channels for the movement of domains, the direction of movement of bubble domains in said first channel being substantially perpendicular to the direction of movement of bubble domains in said second channel, said first and second channels being arranged so that an orthogonal transition in the direction of movement of said bubble domains takes place when bubbles from said first channel are moving in said second channel, and said second channel being a bubble expander guide structure with a plurality of side-by-side expander arranged in a block with end expanders at opposite ends of said block and a center expander between said end expanders, and with said center expander of said block being arranged so that bubble domains enter said block by propagating into said center expander.

2. A system as defined in claim 1, wherein:
said guide structure is composed of a periodic pattern of discrete magnetic elements.

3. A system as defined in claim 2, wherein at least some of said discrete magnetic elements are asymmetrical chevrons.

4. A system as defined in claim 3, wherein:
one of said chevrons is an asymmetrical chevron including a right angled corner portion in one of said end portions of said one chevron.

5. A system as defined in claim 4, wherein:
said asymmetrical chevrons in said first channel includes a right angle in one of said end portions.

6. A system as defined in claim 4, wherein:
said asymmetrical chevrons in said first channel includes a right angle in both of said end portions.

7. A system as defined in claim 4, wherein:
one of said end portions of said asymmetrical chevron in said first channel includes two right angles.

8. A system as defined in claim 3, wherein:
said chevrons in said first channel are substantially identical asymmetrical chevrons.

9. A system as defined in claim 8, wherein:
said left hand end portion of said asymmetrical chevron includes two right angles and said right hand end portion of said asymmetrical chevron includes one right angle.

10. A system as defined in claim 8, wherein:
said chevrons in said second channel are substantially identical symmetrical chevrons.

11. A system as defined in claim 10, wherein:
one of said chevrons in said second channel adjacent to said first channel is an asymmetric chevron.

12. A system as defined in claim 11, wherein:
said asymmetric chevron in said second channel has a left hand portion including two right angles.

13. A system as defined in claim 11, wherein:
said left hand portion of said asymmetric chevron in said second channel is adjacent to said left hand portion of said asymmetric chevron in said first channel.

14. A system as defined in claim 11, wherein:
said asymmetric chevron in said second channel includes a right hand portion including one right angle.

15. A system as defined in claim 11, wherein:
said asymmetric chevron in said second channel includes a right hand portion substantially adjacent to the left hand portion of the asymmetric chevron in said first channel.

16. A magnetic domain system comprising:
a layer of magnetic material in which magnetic bubble domains can be propagated; and
a bubble domain guide structure coupled to said layer for defining first and second channels for the movement of domains, said first channel orthogonally intersecting said second channel so that a bubble domain propagating in a first direction in said first channel begins propagating in a second direction perpendicular to said first direction after entering said second channel, and said second channel being a bubble expander guide structure with a plurality of side-by-side expanders arranged in a block with end expanders at opposite ends of said block and a center expander between said end expanders, and with a center expander of said block being arranged so that bubble domains enter said block by propagating into said center expander.

17. A magnetic domain system comprising:
a layer of magnetic material in which magnetic bubble domains can be propagated; and
a bubble domain guide structure coupled to said layer for defining first and second channels for the movement of domains, said first channel comprising elements substantially identical to a first shape pattern, said second channel comprising elements substantially identical to a second shape pattern different from said first shape pattern, the direction of movement of bubble domains in said first channel being substantially perpendicular to the direction of movement of bubble domains in said second channel, and said second channel being a bubble expander guide structure with a plurality of side-by-side expanders arranged in a block with end expanders at opposite ends of said block and a center expander between said end expanders, and with a center expander of said block being arranged so that bubble domains enter said block by propagating into said center expander.

18. A magnetic bubble domain system comprising:
a layer of magnetic material in which magnetic bubble domain can be propagated; and
a bubble domain guide structure coupled to said layer for defining first and second channels for the movement of domains, the direction of movement of bubble domains in said first channel being substantially perpendicular to the direction of movement of bubble domains in said second channel, and said second channel being a bubble expander guide structure which causes bubble domains to be expanded directly on entry to said second channel from said first channel, said expander guide structure having a plurality of side-by-side expanders arranged in a block with end expanders at opposite ends of said block and a center expander between said end expanders, and with said center expander of said block being arranged so that bubble domains enter said block by propagating into said center expander.

19. A magnetic bubble domain system comprising:
a layer of magnetic material in which magnetic bubble domains can be propagated; and
a bubble domain guide structure coupled to said layer for defining first and second channels for the movement of domains, the direction of movement of bubble domains in said first channel being substantially perpendicular to the direction of movement of bubble domains in said second channel, said second channel being a bubble expander guide structure made up of a block of guide elements laid out so that bubble domains moving through said second channel are not propagated by any of said guide elements which are not adjacent to another of said guide elements on said second channel in a direction perpendicular to said direction of movement of bubble domains in said second channel, said guide elements are substantially identically shaped, and said expander guide structure having a plurality of side-by-side expanders of said elements in said block with end expanders at opposite ends of said block and a center expander between said end expander, and with said center expander of said block being arranged so that bubble domains enter said block by propagating into said center expander.

20. The combination comprising:
at least two expander bubble propagation elements arranged in a first row of an expander and having their surfaces uniformly spaced in juxtaposition including a first element at one end of said row and a second element at the other end of said row, said first expander element having a first side with a middle portion and first and second end portions, said second expander element having a first side with a middle portion and first and second end portions,
an input bubble propagation element associated with one of said first sides in said first row,
a second row of bubble propagation elements positioned in said expander on a first side of said first row, and
a third row of bubble propagation elements positioned in said expander on the second side of said first row whereby a bubble propagating from said input element to one of said expander elements first sides will expand to form a stripe in said expander.

21. The combination as described in claim 20 wherein said expander elements are chevrons.

22. The combination as described in claim 20 wherein said input element faces and is associated with said first side of said first expander element.

23. The combination as described in claim 20 wherein said input element is associated with said first end portion of said first side of said first expander element.

24. The combination as described in claim 20 wherein said input element has a first side which is parallel to a portion of said first side of said first expander element.

* * * * *